(12) United States Patent
Tokumoto

(10) Patent No.: US 8,897,914 B2
(45) Date of Patent: Nov. 25, 2014

(54) CONVEYANCE SYSTEM AND METHOD OF COMMUNICATION IN CONVEYANCE SYSTEM

(75) Inventor: Mitsuya Tokumoto, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 107 days.

(21) Appl. No.: 13/702,324

(22) PCT Filed: Jun. 10, 2010

(86) PCT No.: PCT/JP2010/059837
§ 371 (c)(1),
(2), (4) Date: Dec. 6, 2012

(87) PCT Pub. No.: WO2011/155040
PCT Pub. Date: Dec. 15, 2011

(65) Prior Publication Data
US 2013/0079920 A1 Mar. 28, 2013

(51) Int. Cl.
*G06F 7/00* (2006.01)
*H01L 21/67* (2006.01)
*H01L 21/677* (2006.01)
*G06F 17/00* (2006.01)

(52) U.S. Cl.
CPC ........ *G06F 17/00* (2013.01); *B65G 2201/0297* (2013.01); *H01L 21/67276* (2013.01); *H01L 21/6773* (2013.01); *H01L 21/67736* (2013.01); *H01L 21/67769* (2013.01)
USPC ............ 700/228; 700/213; 700/214; 700/217

(58) Field of Classification Search
None
See application file for complete search history.

(56) References Cited

U.S. PATENT DOCUMENTS

2007/0237609 A1 10/2007 Nulman et al.
2009/0317212 A1* 12/2009 Munson, Jr. ............... 414/138.1

FOREIGN PATENT DOCUMENTS

| EP | 1 134 641 A1 | 9/2001 |
|---|---|---|
| JP | 11-220001 A | 8/1999 |
| JP | 2001-298069 A | 10/2001 |
| JP | 2007-228068 A | 9/2007 |
| JP | 2009-071120 A | 4/2009 |

OTHER PUBLICATIONS

English translation of Official Communication issued in corresponding Singaporean Patent Application No. 201208751-6, written on May 28, 2013.
Official Communication issued in International Patent Application No. PCT/JP2010/059837, mailed on Sep. 14, 2010.

* cited by examiner

Primary Examiner — Yolanda Cumbess
(74) Attorney, Agent, or Firm — Keating & Bennett, LLP

(57) ABSTRACT

An automated warehouse is attachable and detachable to a processing equipment without requiring an operation to change wiring of a first controller when attaching and detaching the automated warehouse. The automated warehouse is attachable and detachable in front of the apparatus including a first loading port and a first controller, the automated warehouse including a second loading port to transfer an article between a transfer vehicle and a second controller. A communication terminal disposed within a range allowing communication with the transfer vehicle for an article, and a communication apparatus connected with the communication terminal are provided. The communication apparatus includes a switch that switches a connection destination of the first controller between the second controller and the communication terminal.

7 Claims, 7 Drawing Sheets

F I G. 1
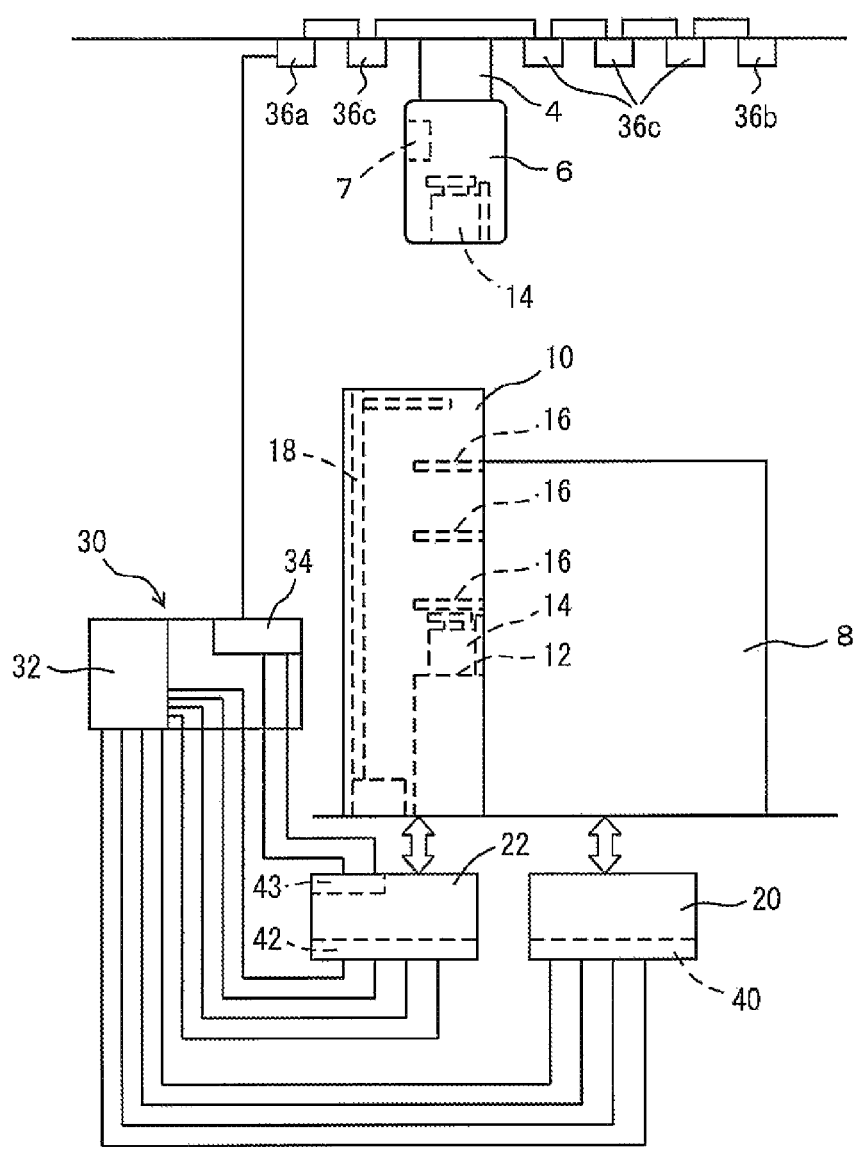

F I G. 4
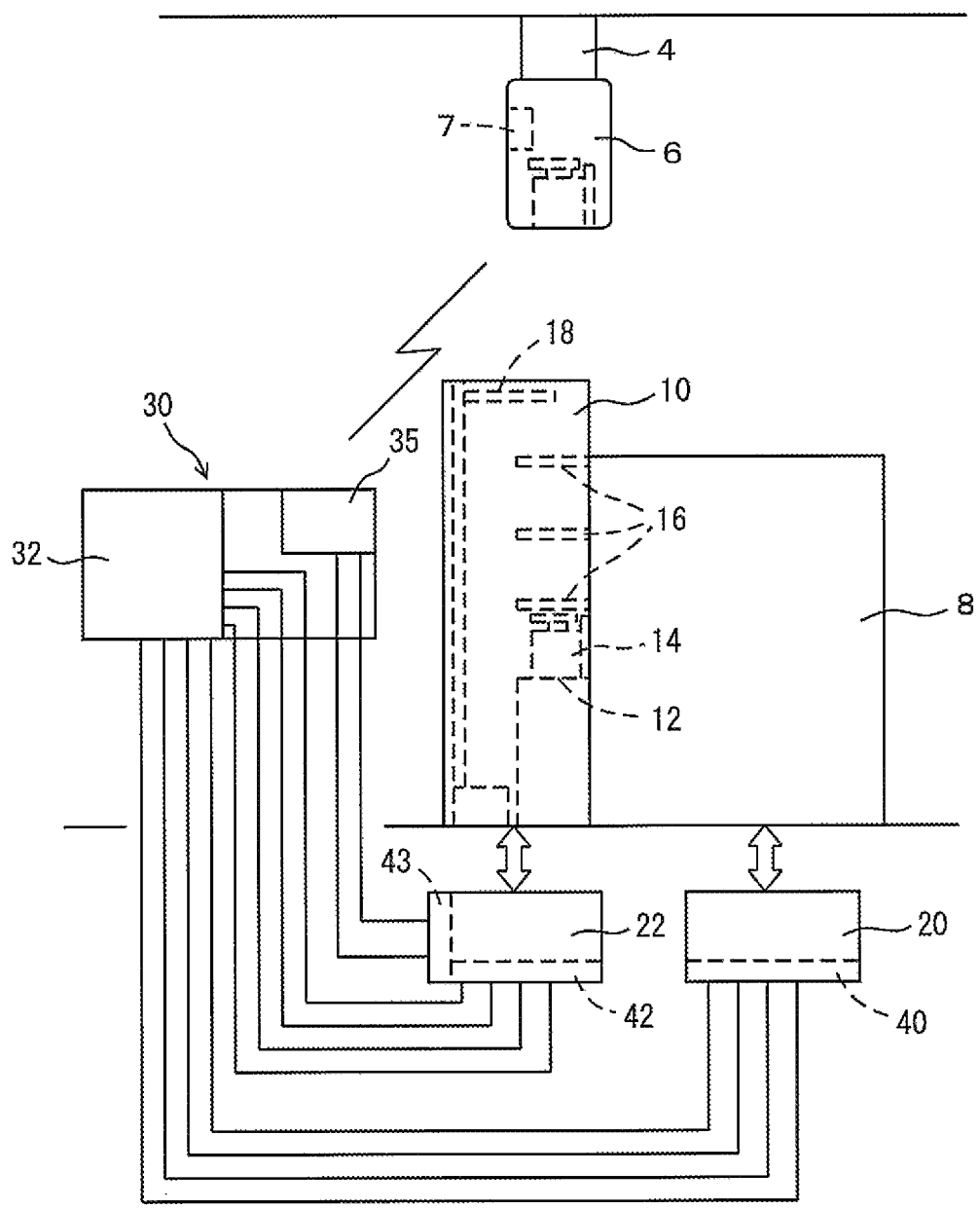

Prior Art

F I G. 7
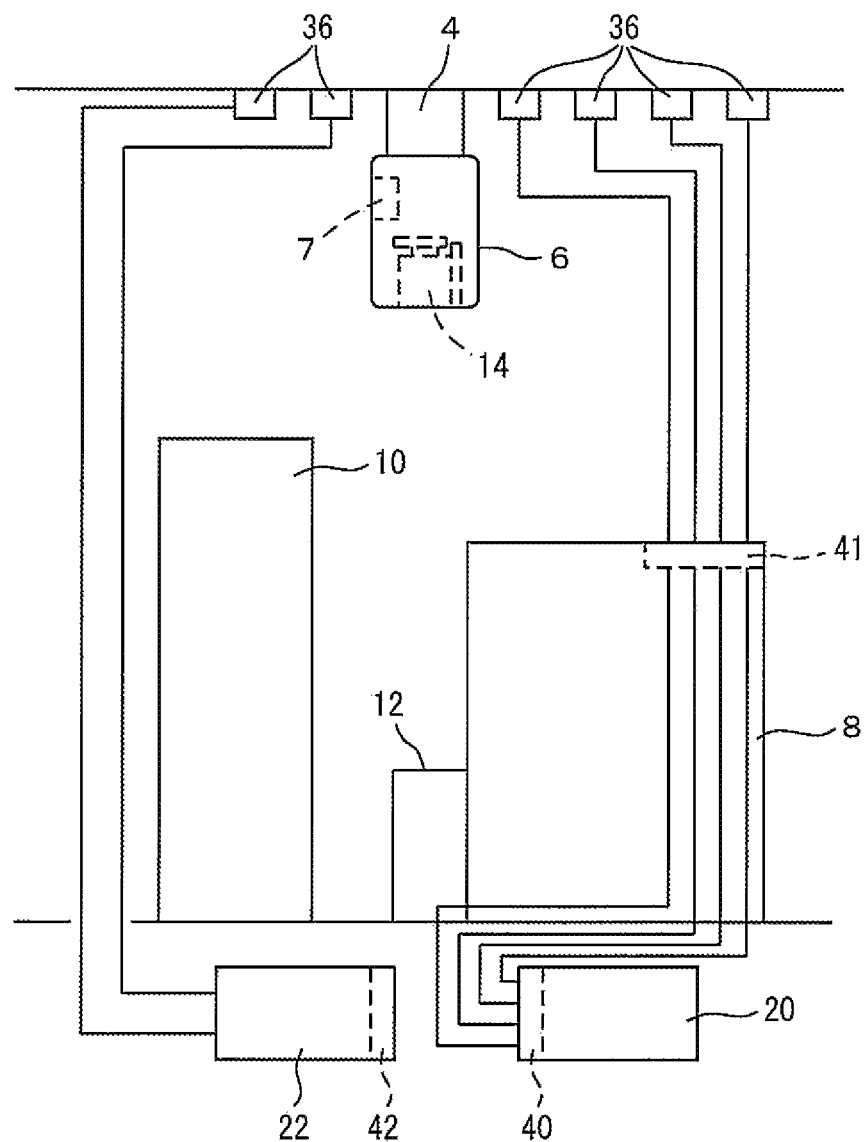
Comparative Example

* CONVEYANCE SYSTEM AND METHOD OF COMMUNICATION IN CONVEYANCE SYSTEM

BACKGROUND OF THE INVENTION

1. Field of the Invention

The present invention relates to a transfer system, and particularly relates to communication in a transfer system.

2. Description of the Related Art

In performing semiconductor transfer in a clean room or the like, there is a known technique in which an automated warehouse is installed so as to cover loading ports of processing equipment, and is used to relay the transfer of articles between a transfer vehicle and the loading ports (e.g., JP 2001-298069A). FIG. 6 shows a transfer system using the automated warehouse. In this drawing, reference numeral 4 denotes a traveling rail, and 6 denotes an overhead traveling vehicle including a communication unit 7 that communicates with communication terminals 36 arranged above loading ports 12 around the traveling rail 4. Furthermore, reference numeral 8 denotes a processing equipment that processes semiconductor wafers or the like and that is provided with one or a plurality of loading ports 12. Reference numeral 10 denotes the automated warehouse that is provided with a plurality of shelves 16 and an in-warehouse transfer apparatus 18. Articles such as FOUPs 14 are transferred between the overhead traveling vehicle 6 and the shelves 16 of the automated warehouse 10, and are further transferred by the in-warehouse transfer apparatus 18 between the shelves 16 and the loading ports 12.

Before transferring articles to and from the shelves 16 or the loading ports 12, the overhead traveling vehicle 6 has to communicate with a ground-side controller 20 or 22. Thus, the communication terminals 36 are arranged above the loading ports 12 and around the traveling rail 4, and are caused to communicate with the communication unit 7 of the overhead traveling vehicle 6 through optical communication. The communication terminals 36 are provided respectively for the loading ports 12, and respectively for the shelves 16 with respect to which the overhead traveling vehicle 6 may transfer articles. FIG. 6 shows a case in which four loading ports 12 and two shelves 16 are arranged such that the overhead traveling vehicle 6 may transfer articles thereto. Furthermore, since the overhead traveling vehicle 6 does not directly transfer articles to the loading ports 12, a connector 41 is disconnected from the wiring to the controller 20. Moreover, the controller 20 of the processing equipment 8 is connected via connectors 40 and 42 to the controller 22 of the automated warehouse 10. Furthermore, the controller 22 of the automated warehouse 10 is connected via a connector 43 to the communication terminals 36.

Regarding this aspect, the inventor of the present application conducted research concerning the possibility of making the automated warehouse 10 attachable and detachable with respect to the apparatus 8 as shown in FIG. 7. Note that FIG. 7 illustrates results of the research conducted by the inventor, and does not illustrate a known system. When the automated warehouse 10 is detached from the processing equipment 8 as shown in FIG. 7, the connector 42 has to be disconnected, and the connector 41 has to be connected to the controller 20. For this purpose, wiring with a large number of wires has to be performed between the ground side and the ceiling side, and when attaching or detaching the automated warehouse 10, it is necessary to perform switching of the wiring, such as attaching and detaching the connector 41.

SUMMARY OF THE INVENTION

Preferred embodiments of the present invention make it possible to attach and detach an automated warehouse without changing wiring.

Preferred embodiments of the present invention also greatly simplify wiring between the ceiling side and the ground side.

According to a preferred embodiment of the present invention, a transfer system for transporting an article into or out of a processing equipment including a first loading port and a first controller, includes a transfer vehicle for an article; the automated warehouse being provided with a second controller and a second loading port that transfers an article between the transfer vehicle, and is attachable and detachable with respect to the processing equipment; a communication terminal disposed within a range allowing communication with the transfer vehicle; and a communication apparatus connected with the communication terminal, and provided with a switch that switches a connection destination of the first controller between the second controller and the communication terminal.

Furthermore, according to another preferred embodiment of the present invention, a method of communication in a transfer system for transporting an article into or out of a processing equipment provided with a first loading port and a first controller, the transfer system including a transfer vehicle for an article; the automated warehouse being provided with a second controller and a second loading port to transfer an article between the transfer vehicle, and being attachable and detachable with respect to the processing equipment; a communication terminal disposed within a range allowing communication with the transfer vehicle; and a communication apparatus connected with the communication terminal; the method including the step of causing a switch in the communication apparatus to connect the first controller to the second controller when the automated warehouse is set at the processing equipment, and to connect the first controller to the communication terminal when the automated warehouse is detached from the processing equipment.

According to various preferred embodiments of the present invention, in order to selectively make either the first loading port or the second loading port effective, it is sufficient to operate the switch, and it is not necessary to perform an operation that cancels the connection between the controller of the apparatus and the controller of the automated warehouse, and connects the controller of the apparatus to the communication terminal again.

It is preferable that the switch connects the first controller to the second controller when the automated warehouse is set at the processing equipment, and connects the first controller to the communication terminal when the automated warehouse is detached from the processing equipment. With this configuration, it is not necessary to perform an operation that connects the wiring again when attaching and detaching the automated warehouse.

It is preferable that at least one communication terminal is provided for the automated warehouse and at least one communication terminal is provided for the processing equipment, the number of communication terminals provided is preferably a plural number in total, the plurality of communication terminals are connected in series and transmit communication data in series, only one communication terminal on a base end side of the plurality of communication terminals is connected to the communication apparatus, and one of the plurality of communication terminals communicates with the transfer vehicle, and communicates via the communication terminal on the base end side with the communication apparatus. With this configuration, the wiring between the communication apparatus and the communication terminals may be realized with one wire, and it is not necessary to individually arrange wiring for each of the automated warehouse and the apparatuses or for each of the loading ports.

Furthermore, another preferred embodiment of the present invention is directed to a transfer system for transporting an article into or out of a processing equipment provided with a first loading port and a first controller, the transfer system including a transfer vehicle for an article; the automated warehouse being provided with a second controller and a second loading port to transfer an article between the transfer vehicle, and being attachable and detachable with respect to the processing equipment; and a communication apparatus wirelessly communicating with the transfer vehicle, and provided with a switch that switches a connection destination of the first controller between the second controller and the transfer vehicle.

Furthermore, according to a further preferred embodiment of the present invention, a method of communication in a transfer system for transporting an article into or out of a processing equipment provided with a first loading port and a first controller, the transfer system including a transfer vehicle for an article; an automated warehouse being provided with a second controller and a second loading port to transfer an article between the transfer vehicle, and being attachable and detachable with respect to the processing equipment; and a communication apparatus wirelessly communicating with the transfer vehicle; the method including the step of causing a switch in the communication apparatus to connect the first controller to the second controller when the automated warehouse is set at the processing equipment, and to connect the first controller to the transfer vehicle when the automated warehouse is detached from the processing equipment.

With this configuration, it is sufficient to operate the switch in order to selectively make either the first loading port or the second loading port effective. Furthermore, the communication terminal is not necessary, and the wiring to the communication terminal is not necessary either. Furthermore, the communication may be performed before the transfer vehicle reaches a point near the first and the second loading ports, and, thus, if articles are not allowed to be transferred with respect to the first or second loading port, the transfer vehicle passes through the point without being stopped, and, thus, the transfer efficiency is improved.

Furthermore, according to yet another preferred embodiment of the present invention, a transfer system for transporting an article into or out of an apparatus provided with a first loading port and a first controller, includes a transfer vehicle that transfers an article; the automated warehouse being provided with a second controller and a second loading port to transfer an article between the transfer vehicle, and being attachable and detachable with respect to the processing equipment; a communication terminal disposed within a range allowing communication with the transfer vehicle; and a communication apparatus connected with the communication terminal, and provided with a switch that switches a connection destination of communication from the communication terminal to the communication apparatus, to the second controller when the automated warehouse is set at the processing equipment, and to the first controller when the automated warehouse is detached from the processing equipment.

With this configuration, when attaching and detaching the automated warehouse, the communication destination from the communication terminal is changed by the switch, and, thus, the wiring does not have to be changed.

Furthermore, according to an additional preferred embodiment of the present invention, a transfer system for transporting an article into or out of an apparatus provided with a first loading port and a first controller, includes a transfer vehicle for an article; the automated warehouse being provided with a second controller and a second loading port to transfer an article between the transfer vehicle, and being attachable and detachable with respect to the processing equipment; and a communication apparatus wirelessly communicating with the transfer vehicle, and provided with a switch that switches a connection destination of communication from the transfer vehicle to the communication apparatus, to the second controller when the automated warehouse is set at the processing equipment, and to the first controller when the automated warehouse is detached from the processing equipment.

With this configuration, when attaching and detaching the automated warehouse, the communication destination from the transfer vehicle is changed by the switch, and, thus, the wiring does not have to be changed. Furthermore, the communication apparatus and the transfer vehicle wirelessly communicate with each other, and, thus, it is not necessary to provide the communication terminal at a point near the route on which the transfer vehicle travels. Furthermore, if articles are not allowed to be transferred between the first or second loading port, the transfer vehicle passes through the point without being stopped, and, thus, the transfer efficiency is improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a diagram showing a communication environment of a processing equipment, an automated warehouse, and an overhead traveling vehicle in a transfer system according to a preferred embodiment of the present invention.

FIG. 4 is a diagram showing a communication environment between the processing equipment, the automated warehouse, and the overhead traveling vehicle in a transfer system according to a preferred embodiment of the present invention.

FIG. 7 is a diagram showing a reference example of an attempt to make the automated warehouse attachable and detachable.

DETAILED DESCRIPTION OF THE PREFERRED EMBODIMENTS

Hereinafter, preferred embodiments of the present invention will be described.

Figure 2:
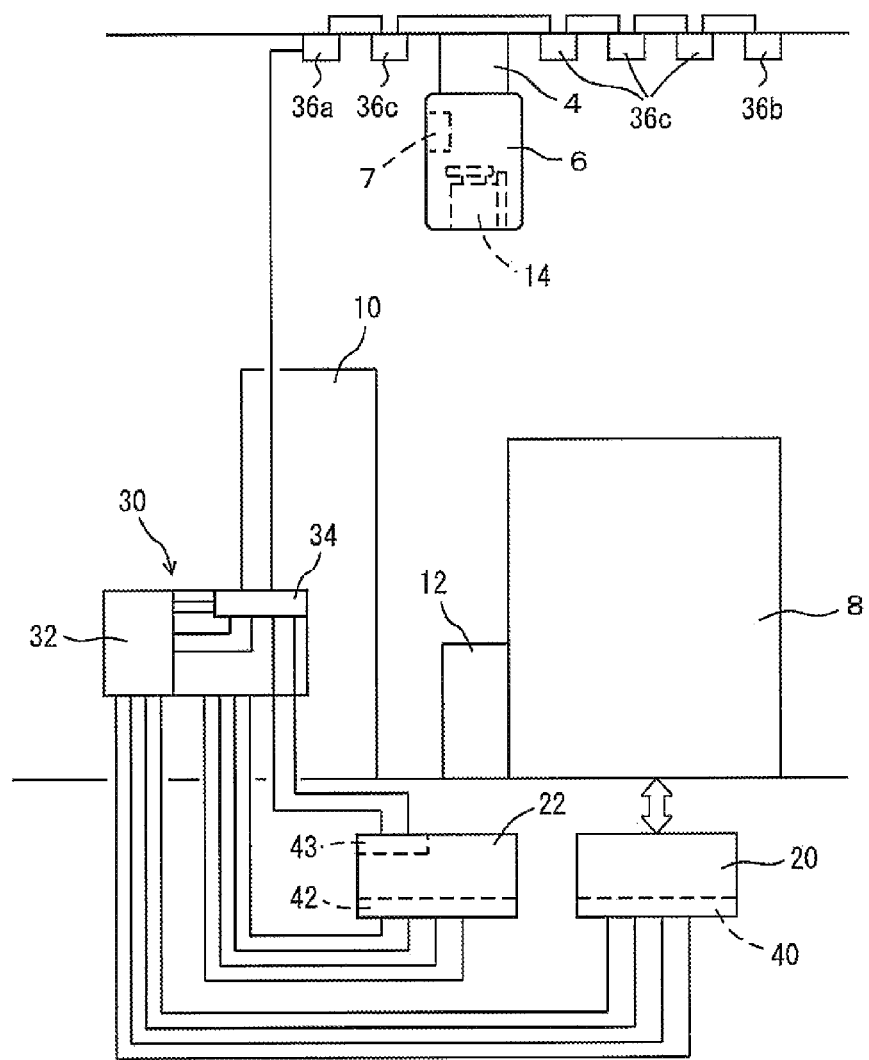
FIG. 2 is a diagram showing a communication environment when the automated warehouse has been detached from a preferred embodiment of the present invention.
Figure 3:
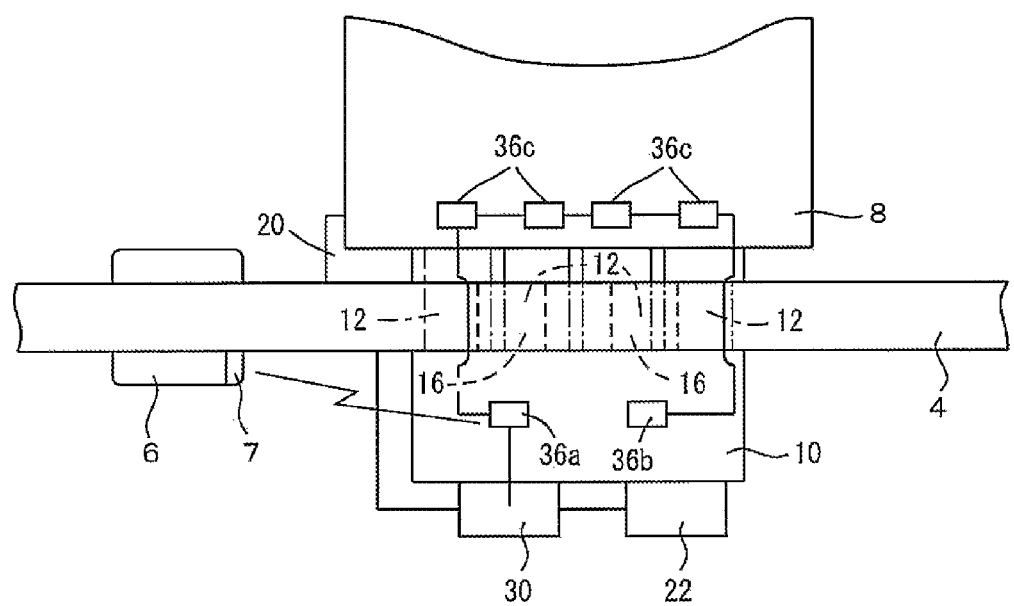
FIG. 3 is a plan view showing a main portion of the transfer system according to a preferred embodiment of the present invention.
Figure 5:
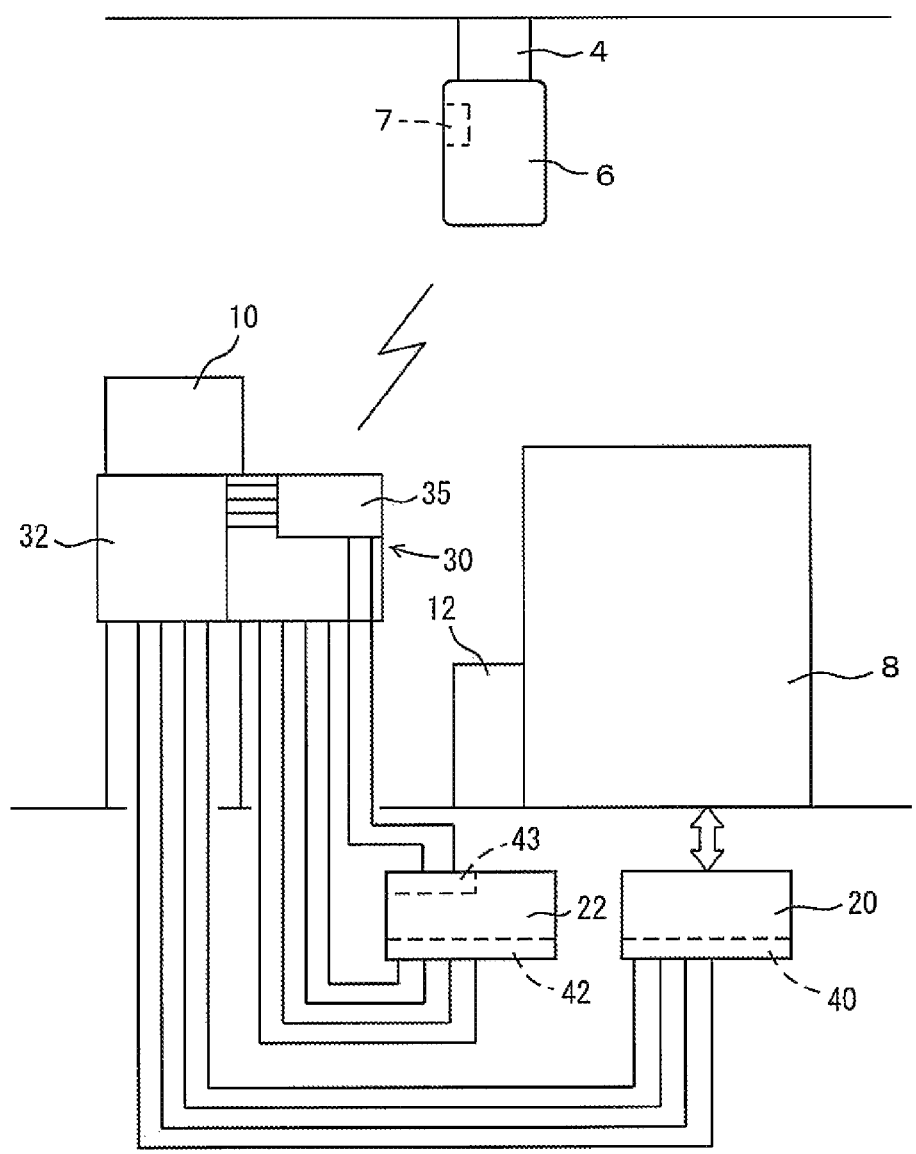
FIG. 5 is a diagram showing a communication environment when the automated warehouse has been detached according to the preferred embodiment of the present invention in FIG. 4.
Figure 6:
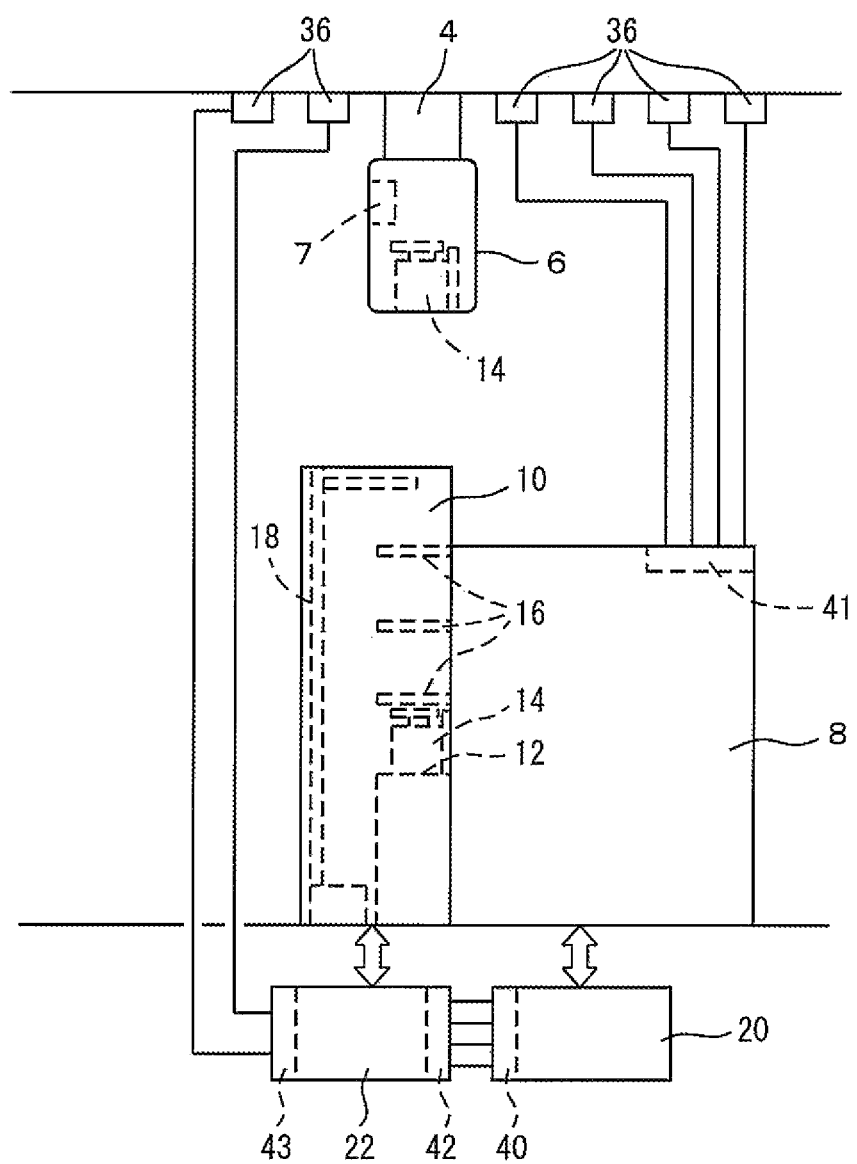
FIG. 6 is a diagram showing a communication environment between a processing equipment, the automated warehouse, and an overhead traveling vehicle in a transfer system according to a conventional example.

FIGS. 1 to 5 show first and second preferred embodiments of the present invention, and a description thereof will be given mainly focusing on differences from the conventional example in FIGS. 6 and 7. Note that the matters whose description will be omitted are well known in the field of semiconductor transfer in a clean room. FIGS. 1 to 3 show the first preferred embodiment, wherein reference numeral 2 denotes a transfer system that conveys semiconductor wafers in a clean room, 4 denotes a traveling rail that is disposed in a ceiling space, and 6 denotes an overhead traveling vehicle that may be a transfer vehicle for ground travel. Furthermore, reference numeral 8 denotes a processing equipment that processes semiconductor wafers or the like and that is provided with one or a plurality of (e.g., in the drawing, four) loading ports 12. The controller 20 controls the processing equipment 8 including the loading ports 12. Note that examples of the processing equipment 8 also include an apparatus for testing semiconductor wafers or the like. Reference numeral 10 denotes the automated warehouse that is attachable and detachable in front of the processing equipment 8. Furthermore, the automated warehouse 10 is provided with the plurality of shelves 16 and the in-warehouse transfer apparatus 18 that transfers articles such as the FOUPs 14 between the shelves 16 and the loading ports 12. Among the shelves 16, one or a plurality of (e.g., in the drawing, two) shelves 16 may transfer articles with respect to the overhead traveling vehicle 6. The loading ports 12 of the processing equipment 8 are referred to as first loading ports, and the shelves 16 of the automated warehouse 10 are referred to as second loading ports.

The overhead traveling vehicle 6 communicates with communication terminals 36a to 36c in its surrounding area, that is, in a possible communication range, using the communication unit 7 through wireless, optical, infrared, or other type of communication. The plurality of communication terminals 36a to 36c are preferably connected in series in a daisy chain, for example, and the communication terminal 36a that is located at the base end of the daisy chain is connected via a wire with a communication apparatus 30, for example. The communication terminal 36b is a communication terminal that is located at the distal end of the daisy chain, and the communication terminals 36c are communication terminals that are serving as relays. Furthermore, as shown in FIG. 3, the communication terminals 36a to 36c are arranged above the loading ports 12 and the shelves 16, and do not form part of a LAN that extends along the traveling rail 4.

FIG. 3 shows the transfer system viewed from the ceiling side, wherein the processing equipment 8 is provided with, for example, four loading ports 12 directly below the traveling rail 4, and the communication terminals 36c respectively corresponding to the loading ports 12 are arranged near the respective loading ports 12. Furthermore, the automated warehouse 10 includes, for example, two shelves 16 with respect to which the overhead traveling vehicle 6 may transfer articles, and one communication terminal near each shelf 16, that is, two communication terminals 36a and 36b in total are arranged. The communication terminals 36a to 36c are preferably connected in series in a daisy chain, and only the communication terminal 36a on the base end side is connected with a communication unit 34 of the communication apparatus 30, for example.

The communication apparatus 30 on the ground side is provided with a distributor 32 and the communication unit 34. The distributor 32 switches, between the controller 22 and the communication unit 34, a connection destination of the wiring connected from the controller 20 via the connector 40. The distributor 32 is an example of a switch, and the switch may be an electrical switch using a relay or the like, or may be an electronic switch using a semiconductor, for example. Furthermore, the communication unit 34 communicates with the communication terminal 36a that is located at the base end of the daisy chain.

When the automated warehouse 10 has been attached to the processing equipment 8, the distributor 32 causes the wiring connected from the controller 20 to the communication apparatus 30 to be connected to the controller 22. Accordingly, the controllers 20 and 22 communicate with each other, and may exchange data regarding the transfer between the automated warehouse 10 and the loading ports 12. When the automated warehouse 10 has been detached from the processing equipment 8 as shown in FIG. 2, the distributor 32 causes the wiring from the controller 20 to be connected to the communication unit 34. Accordingly, the controller 20 and the communication terminals 36a to 36c are connected with each other, and may exchange data regarding the transfer between the loading ports 12 and the overhead traveling vehicle 6.

In order to perform communication in a state in which the communication terminals 36a to 36c are identified, the communication unit 7 of the overhead traveling vehicle 6 adds the port number or the like to communication data as an ID of each communication terminal and sends the communication data. Furthermore, the communication unit 34 adds the port number or the like to communication data as an ID indicating from which wiring inside the communication apparatus 30 the signal has been received, and sends the communication data to the communication terminals 36a to 36c. Furthermore, the daisy chain constituted by the communication terminals 36a to 36c transmits data using IDs of the communication terminals 36a to 36c as a source address or a destination address. In the communication from the communication unit 34, the communication terminals 36a to 36c not designated as the destination address transmit a signal to the distal end side, and the communication terminals 36a to 36c designated as the destination address send a signal to the communication unit 7 without transmitting it to the distal end side. In the communication from the communication unit 7, the communication terminals 36a to 36c designated as the destination address receive a signal and transmit it to the base end side of the daisy chain. In this specification, the daisy chain being constituted by the communication terminals 36a to 36c refers to a state in which the communication terminals are connected in series from the communication terminal 36a at the base end to the communication terminal 36b at the distal end, and in which the intermediate communication terminals 36c function as relay terminals. Furthermore, the physical configuration is such that the intermediate communication terminals 36c are connected with the adjacent communication terminals 36a to 36c on the base end side and the distal end side of the daisy chain via the same type of connector. The communication terminals 36a and 36b at the base end and the distal end are preferably connected with the communication terminals 36c via the same type of connector, for example. Furthermore, the communication method itself is freely selected from among full duplex, half duplex, and the like.

In a state in which the automated warehouse 10 has been attached to the processing equipment 8 as shown in FIG. 1, the overhead traveling vehicle 6 communicates via the communication unit 7 with appropriate communication terminals 36a to 36c, and the communication result is input via the daisy chain to the communication unit 34 and is conveyed to the controller 22. The communication from the controller 22 is conveyed through the opposite route from the communication terminals 36a to 36c to the communication unit 7. The controller 20 and the controller 22 communicate with each other via the distributor 32.

On the other hand, when the automated warehouse 10 has been detached as shown in FIG. 2, the connection destination of the wiring from the controller 20 is switched by the distributor 32 to the communication unit 34, and, thus, the controller 20 may communicate with the overhead traveling vehicle 6. Thus, even when the automated warehouse 10 has been detached, it is possible to transfer articles between the loading ports 12 and the overhead traveling vehicle 6 only by causing the distributor 32 to switch the connection destination. As a result, the following effects are obtained. The number of wires connecting the ceiling side and the ground side may be only one, so that the wiring operation is simple. In order to attach and detach the automated warehouse 10, switching only at the distributor 32 is necessary, and switching at the connectors 40 to 42 as shown in the conventional example in FIGS. 6 and 7 is not necessary.

Although, in the preferred embodiment in FIGS. 1 and 2, the communication terminals 36a to 36c and the overhead traveling vehicle 6 preferably communicate with each other, the overhead traveling vehicle 6 may directly communicate with the communication apparatus 30 on the ground side. FIGS. 4 and 5 show a preferred embodiment having such a configuration. This preferred embodiment is preferably the same as the preferred embodiment in FIGS. 1 and 2 unless otherwise specified. Note that the communication apparatus 30 is provided with a communication unit 35 to perform wireless communication, optical communication, infrared communication, or the like, instead of the wired communication unit 34. Thus, the communication terminals 36a to 36c are not necessary, but, in order to specify any of the loading ports 12 and the shelves 16 as a transfer target regarding which the communication is being performed, the IDs of the communication terminals 36a to 36c are used assuming that these communication terminals are virtually present. The communication unit 7 of the overhead traveling vehicle 6 specifies the ID of one of the virtual communication terminals 36a to 36c, and communicates with the communication unit 35. Also, the communication unit 35 adds the ID of one of the virtual communication terminals 36a to 36c, and communicates with the communication unit 7. The communication between the communication unit 35 and the communication unit 7 is performed after adding the ID of one of the communication terminals 36a to 36c, and, thus, focusing on the overhead traveling vehicle 6, the communication is performed in the same environment and following the same procedure as those shown in FIGS. 1 and 2. Also, focusing on the controllers 20 and 22, the communication is performed following the same procedure as that shown in FIGS. 1 and 2. This preferred embodiment is different from the foregoing preferred embodiment in that the communication unit 35 on the ground side directly communicates with the communication unit 7 on the overhead traveling vehicle side using the IDs of the respective communication terminals 36a to 36c.

FIG. 4 shows a state in which the automated warehouse 10 has been set at the processing equipment 8, wherein the controller 22 communicates via the communication unit 35 with the overhead traveling vehicle 6, and communicates via the distributor 32 with the controller 20. FIG. 5 shows a state in which the automated warehouse 10 has been detached from the processing equipment 8. The distributor 32 changes the connection destination of the controller 20, from the controller 22 to the communication unit 35, and the controller 20 communicates via the distributor 32 and the communication unit 35 with the overhead traveling vehicle 6.

According to the preferred embodiment shown in FIGS. 4 and 5, the wiring between the ceiling space and the ground side is not necessary. Furthermore, the overhead traveling vehicle 6 may communicate with the communication unit 35 before it reaches a point directly above the automated warehouse 10 or the loading ports 12. Accordingly, data regarding the transfer of articles is exchanged before the overhead traveling vehicle 6 reaches a destination point, and, for example, if the articles are not allowed to be transferred, the overhead traveling vehicle 6 may pass through a point above the loading ports 12 and the automated warehouse 10 without being stopped, preferably, without being slowed down. Accordingly, the overhead traveling vehicle 6 is kept from being unnecessarily stopped, and, thus, congestion of such overhead traveling vehicles is eased.

In the foregoing preferred embodiments, the controller 22 preferably is always connected with the communication unit 34 or 35. However, when the automated warehouse 10 is detached from the processing equipment 8, the distributor 32 may cancel the connection between the controller 22 and the communication unit 34 or 35. The distributor 32 may automatically perform the switching upon detecting that the automated warehouse 10 is attached to or detached from the processing equipment 8, or may perform the switching through a manual operation. The above-described preferred embodiments show the processing equipment 8 as an apparatus that is preferably provided with the loading ports 12, but the preferred embodiments are applicable also to other apparatuses such as testing apparatuses. Furthermore, articles that are to be conveyed may be articles other than semiconductor wafers, such as reticles. The automated warehouse 10 preferably uses the shelves 16 to transfer articles with respect to the overhead traveling vehicle 6, but may use loading ports other than the shelves, for example.

Furthermore, in the foregoing preferred embodiments, even when the automated warehouse 10 has been detached from the processing equipment 8, the wiring from the communication apparatus 30 and the controller 22 is effective. However, the wiring between the communication unit 34 or 35 and the controller 22 may be arranged so as to extend via the distributor 32, so that, when the automated warehouse 10 is detached from the processing equipment 8, the communication between the communication unit 34 or 35 and the controller 22 may be blocked.

Hereinafter, the signal flow according to the preferred embodiment shown in FIGS. 1 to 3 will be described again. The overhead traveling vehicle 6 is stopped at a position near one of the loading ports 12 and the shelves 16 to and from which articles are to be transferred, and the overhead traveling vehicle 6 adds the ID of the loading port 12 or the shelf 16 to an article transfer signal and sends the signal to the communication terminals 36a to 36c. The communication terminals 36a to 36c are connected with each other in a daisy chain, and the signal is sent from the communication terminal 36a on the base end side to the communication unit 34 of the communication apparatus 30. When the automated warehouse 10 has been set at the processing equipment 8 as shown in FIG. 1, a signal to which the IDs of the communication terminals 36a to 36c corresponding to the loading ports 12 have been added is not transmitted from the communication apparatus 30 to the controller 22, and, for example, an error occurs with no response returned. Note that such a signal may be transmitted to the controller 22, and the controller 22 may give a response with a signal indicating, for example, that articles are not allowed to be transferred with respect to the loading ports 12, but are allowed to be transferred to and from the shelves 16. Furthermore, a signal to which the ID corresponding to the shelves 16 is transmitted to the controller 22, and a response is given through the opposite route with a signal indicating, for example, that articles are allowed to be transferred.

When the automated warehouse 10 has been detached from the processing equipment 8 as shown in FIG. 2, a signal to which the ID of the loading ports 12 has been added is transmitted from the communication apparatus 30 to the controller 20, and a response from the controller 20 is given via the distributor 32, the communication unit 34, and the communication terminal 36a to one of the communication terminals 36a to 36c specified by that ID. A signal to which the ID corresponding to the shelves 16 has been added is transmitted from the communication unit 34 to the controller 22, but, since the automated warehouse 10 is not allowed to transfer articles, an error occurs with an error signal returned or with no response returned. At that time, the communication unit 34 may ignore a signal to which the ID corresponding to the shelves 16 has been added, without transmitting it to the controller 22.

According to the preferred embodiment shown in FIGS. 4 and 5, no communication terminals 36a to 36c are provided, so that the overhead traveling vehicle 6 sends a signal regarding the transfer from the communication unit 7 to the communication unit 35 while advancing from the upstream side of the loading ports 12 or the shelves 16 without being stopped. In a state in which the automated warehouse 10 has been set at the processing equipment 8 as shown in FIG. 4, for example, a signal to which the ID corresponding to the loading ports 12 has been added is not processed by the communication unit 35, and a time-out error occurs on the overhead traveling vehicle 6 side. Note that such a signal may be transmitted to the controller 22, and be processed on the controller 22 side. Furthermore, the overhead traveling vehicle 6 starts communication without being stopped, and, if exchange of a signal regarding the transfer is not successfully performed, the overhead traveling vehicle 6 may be slowed down, but is not stopped. Furthermore, a signal to which the ID corresponding to the shelves 16 has been added is transmitted to the controller 22, and a response is given from the controller 22 side via the communication unit 35 to the communication unit 7 of the overhead traveling vehicle 6.

In a state in which the automated warehouse 10 has been detached from the processing equipment 8 as shown in FIG. 5, the communication from the communication unit 7 of the overhead traveling vehicle 6 is distributed by the communication unit 35 to the controller 20 or 22 according to the added ID. In the communication to the controller 22, for example, an error occurs with no response returned, and the controller 20 gives a response with a signal regarding the transfer with respect to the loading ports 12. Also in this case, the overhead traveling vehicle 6 exchanges a signal regarding the transfer, without being stopped.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transfer system for transporting an article into or out of a processing equipment including a first loading port and a first controller, the transfer system comprising:
   a transfer vehicle for an article;
   an automated warehouse including a second controller and a second loading port to transfer an article to and from the transfer vehicle, the second loading port being attachable and detachable in front of the processing equipment;
   a communication terminal disposed within a range allowing communication with the transfer vehicle; and
   a communication apparatus connected with the communication terminal, the communication apparatus including a switch that switches a connection destination of the first controller between the second controller and the communication terminal; wherein
   the switch connects the first controller to the second controller when the automated warehouse is set in front of the processing equipment, and connects the first controller to the communication terminal when the automated warehouse is detached from the processing equipment.

2. The transfer system according to claim 1, further comprising a plurality of communication terminals, including at least one communication terminal corresponding to the automated warehouse and at least one communication terminal corresponding to the processing equipment, wherein
   the plurality of communication terminals is connected in series and transmits communication data in series;
   only one of the plurality of communication terminals on a base end side of the warehouse is connected to the communication apparatus; and
   the plurality of communication terminals is configured so that one of the plurality of communication terminals communicates with the transfer vehicle and with the communication apparatus via the communication terminal on the base end side.

3. A transfer system for transporting an article into or out of a processing equipment including a first loading port and a first controller, the transfer system comprising:
   a transfer vehicle for an article;
   an automated warehouse including a second controller and a second loading port to transfer an article to and from the transfer vehicle, the second loading port being attachable and detachable in front of the processing equipment; and
   a communication apparatus wirelessly communicating with the transfer vehicle, the communication apparatus including a switch that switches a connection destination of the first controller between the second controller and the transfer vehicle.

4. A method of communication within a transfer system for transporting an article into or out of a processing equipment including a first loading port and a first controller, the transfer system including a transfer vehicle for an article, an automated warehouse provided with a second controller and a second loading port to transfer an article to and from the transfer vehicle, the second loading port being attachable and detachable in front of the processing equipment, a communication terminal disposed within a range allowing communication with the transfer vehicle, and a communication apparatus connected with the communication terminal, the method comprising:
   a step of causing a switch in the communication apparatus to connect the first controller to the second controller when the automated warehouse is set in front of the processing equipment; and
   a step of causing the switch in the communication apparatus to connect the first controller to the communication terminal when the automated warehouse is detached from the processing equipment.

5. A method of communication within a transfer system for transporting an article into or out of a processing equipment including a first loading port and a first controller, the transfer system including a transfer vehicle for an article, an automated warehouse provided with a second controller and a second loading port to transfer an article to and from the transfer vehicle, the second loading port being attachable and detachable in front of the processing equipment, and a communication apparatus wirelessly communicating with the transfer vehicle, the method comprising:

a step of causing a switch in the communication apparatus to connect the first controller to the second controller when the automated warehouse is set in front of the processing equipment; and a step of causing the switch in the communication apparatus to connect the first controller to the transfer vehicle when the automated warehouse is detached from the processing equipment.

6. A transfer system for transporting an article into or out of an apparatus including a first loading port and a first controller, comprising:

a transfer vehicle for an article;

an automated warehouse including a second controller and a second loading port for transferring an article to and from the transfer vehicle, the second loading port being attachable and detachable in front of the processing equipment;

a communication terminal disposed within a range allowing communication with the transfer vehicle; and a communication apparatus connected with the communication terminal, the communication apparatus including a switch for switching a connection destination of communication from the communication terminal to the second controller when the automated warehouse is set in front of the processing equipment, and to the first controller when the automated warehouse is detached from the processing equipment.

7. A transfer system for transporting an article into or out of an apparatus including a first loading port and a first controller, comprising:

a transfer vehicle for an article;

an automated warehouse provided with a second controller and a second loading port for transferring an article to and from the transfer vehicle, the second loading port being attachable and detachable in front of the processing equipment; and a communication apparatus wirelessly communicating with the transfer vehicle, the communication apparatus including a switch for switching a connection destination of communication from the transfer vehicle to the second controller when the automated warehouse is set in front of the processing equipment, and to the first controller when the automated warehouse is detached from the processing equipment.

\* \* \* \* \*